(12) United States Patent
Kaneko et al.

(10) Patent No.: US 10,203,612 B2
(45) Date of Patent: Feb. 12, 2019

(54) SUBSTRATE TABLE, A LITHOGRAPHIC APPARATUS AND A METHOD FOR MANUFACTURING A DEVICE USING A LITHOGRAPHIC APPARATUS

(71) Applicant: ASML NETHERLANDS B.V., Veldhoven (NL)

(72) Inventors: Takeshi Kaneko, 's-Hertogenbosch (NL); Joost Jeroen Ottens, Veldhoven (NL); Raymond Wilhelmus Louis Lafarre, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 39 days.

(21) Appl. No.: 15/344,994

(22) Filed: Nov. 7, 2016

(65) Prior Publication Data

US 2017/0052459 A1 Feb. 23, 2017

Related U.S. Application Data

(63) Continuation of application No. 13/022,397, filed on Feb. 7, 2011, now Pat. No. 9,488,919.

(60) Provisional application No. 61/305,482, filed on Feb. 17, 2010.

(51) Int. Cl.
*G03B 27/58* (2006.01)
*G03F 7/20* (2006.01)

(52) U.S. Cl.
CPC ...... *G03F 7/70716* (2013.01); *G03F 7/70341* (2013.01); *G03F 7/70775* (2013.01)

(58) Field of Classification Search
CPC ............ G03F 7/70341; G03F 7/70775; G03F 7/70716
See application file for complete search history.

(56) References Cited

U.S. PATENT DOCUMENTS

| | | |
|---|---|---|
| 4,509,852 A | 4/1985 | Tabarelli et al. |
| 5,997,963 A | 12/1999 | Davison et al. |
| 7,839,485 B2 | 11/2010 | Shibazaki |
| 7,898,642 B2 | 3/2011 | Kolesnychenko et al. |
| 8,599,356 B2 | 12/2013 | Kaneko et al. |
| 8,988,650 B2 | 3/2015 | Westerlaken et al. |
| 2004/0136494 A1 | 7/2004 | Lof et al. |
| 2004/0207824 A1 | 10/2004 | Lof et al. |
| 2005/0231694 A1 | 10/2005 | Kolesnychenko et al. |
| 2006/0038968 A1 | 2/2006 | Kemper et al. |

(Continued)

FOREIGN PATENT DOCUMENTS

| | | |
|---|---|---|
| CN | 1684001 | 10/2005 |
| EP | 1 420 298 | 5/2004 |

(Continued)

OTHER PUBLICATIONS

Korean Office Action dated May 29, 2012 in corresponding Korean Patent Application No. 10-2011-0013603.

(Continued)

*Primary Examiner* — Peter B Kim
(74) *Attorney, Agent, or Firm* — Pillsbury Winthrop Shaw Pittman, LLP

(57) ABSTRACT

A table for a lithographic apparatus, the table having an encoder plate located on the table, a gap between the encoder plate and a top surface of the table, the gap located radially inward of the encoder plate relative to the periphery of the table, and a fluid extraction system with an opening in the surface of the gap to extract liquid from the gap.

20 Claims, 8 Drawing Sheets

(56) References Cited

U.S. PATENT DOCUMENTS

2007/0288121 A1    12/2007  Shibazaki
2009/0208883 A1     8/2009  Nagasaka
2015/0185624 A1     7/2015  Westerlaken et al.

FOREIGN PATENT DOCUMENTS

| EP | 1 420 300      | 5/2004  |
|----|----------------|---------|
| JP | 2009-044186    | 2/2009  |
| JP | 2009-252988    | 10/2009 |
| JP | 2009-260264    | 11/2009 |
| TW | 200604755      | 2/2006  |
| WO | 99/49504       | 9/1999  |
| WO | 2009/060998    | 5/2009  |
| WO | 2009/099021    | 8/2009  |

OTHER PUBLICATIONS

Japanese Office Action dated Aug. 21, 2012 in corresponding Japanese Patent Application No. 2011-028425.
Taiwan Office Action dated Jul. 29, 2013 in corresponding Taiwan Patent Application No. 100105308.

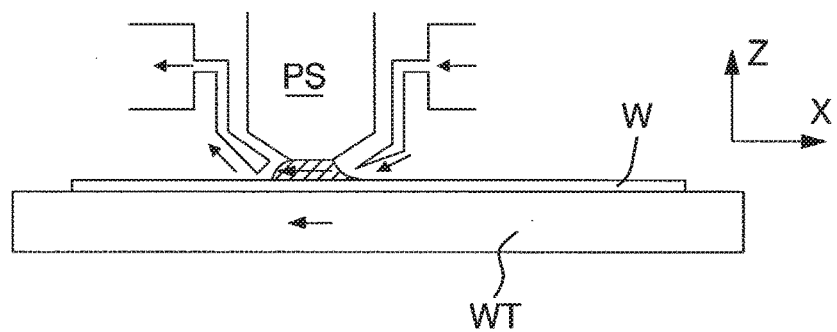
Fig.2.
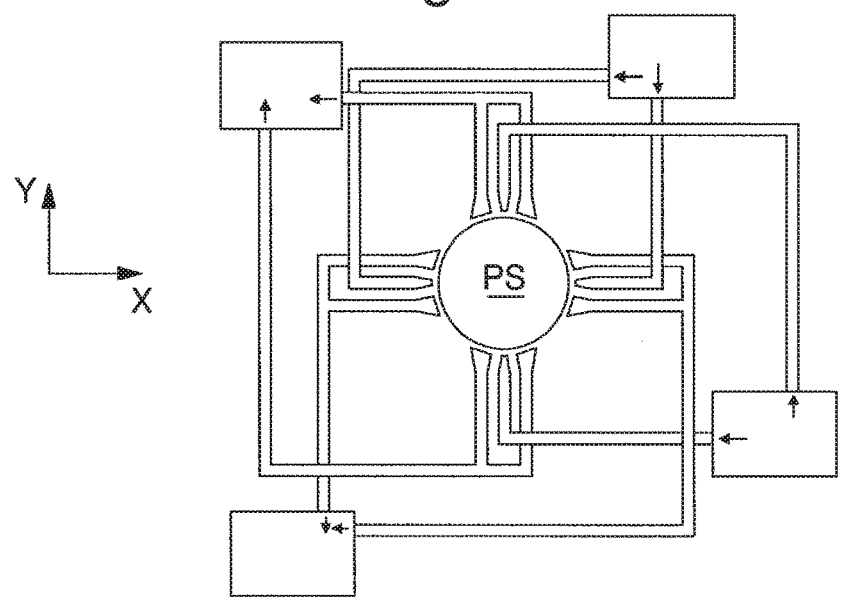
Fig.3.
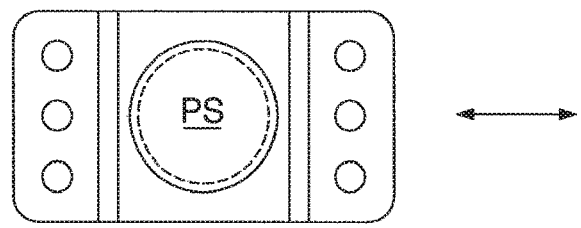
Fig.4.
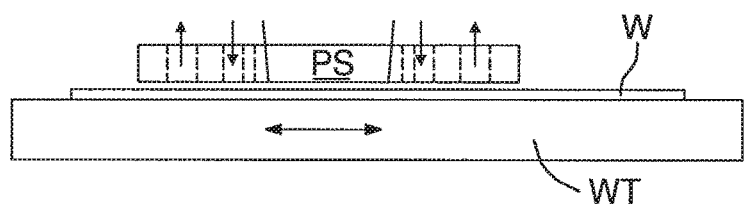

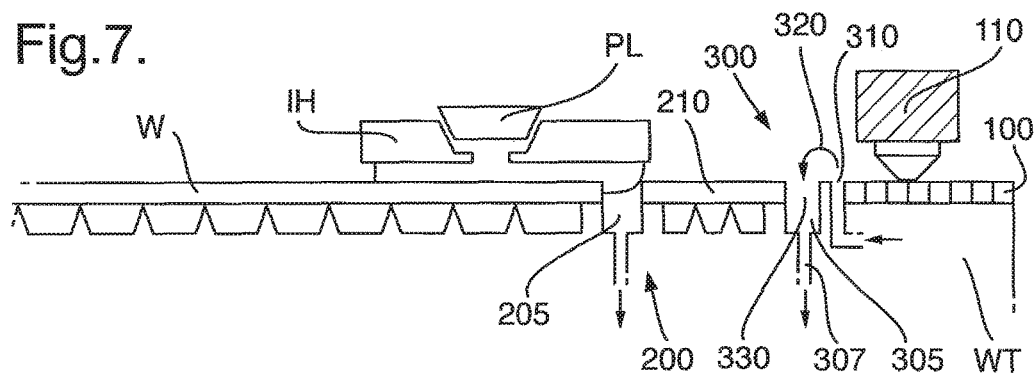
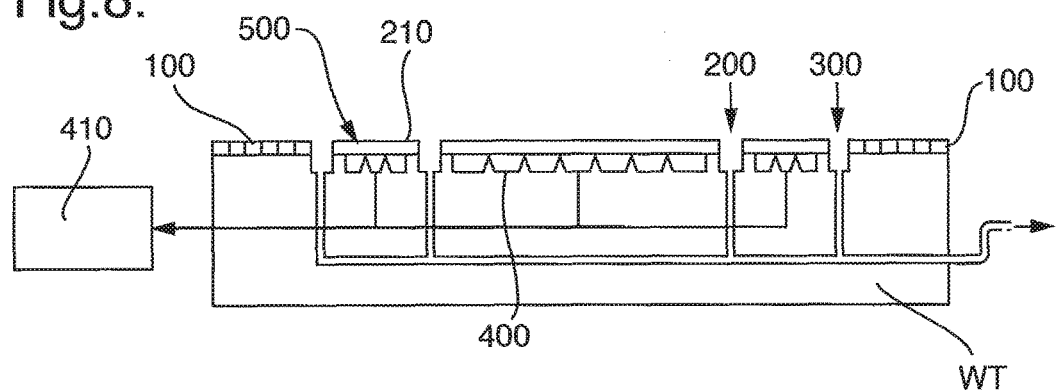
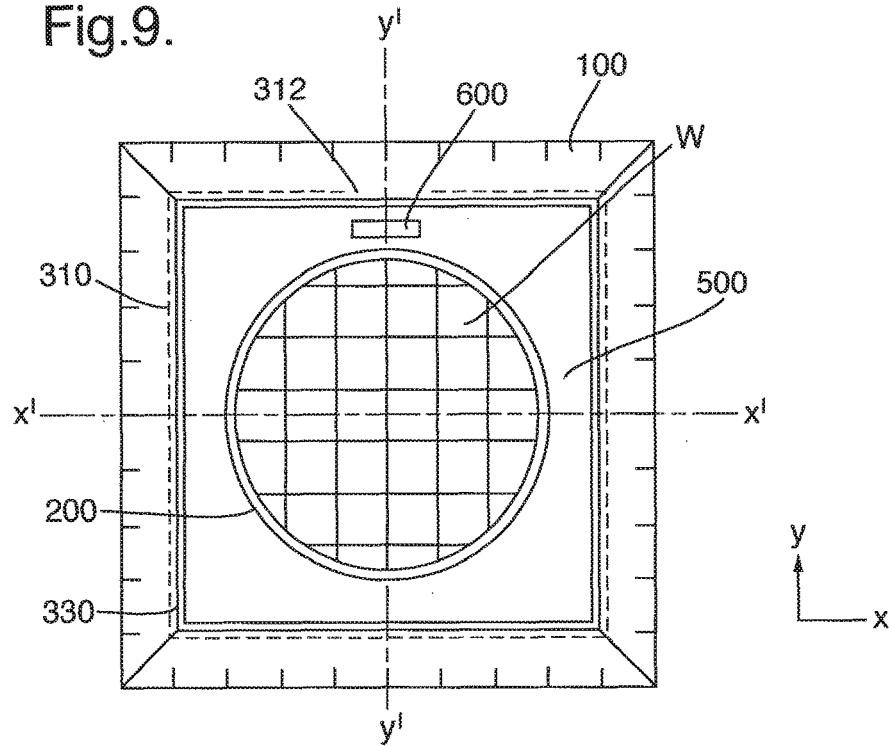

SUBSTRATE TABLE, A LITHOGRAPHIC APPARATUS AND A METHOD FOR MANUFACTURING A DEVICE USING A LITHOGRAPHIC APPARATUS

This application is a continuation of U.S. patent application Ser. No. 13/022,397, filed on Feb. 7, 2011, now allowed, which claims priority and benefit under 35 U.S.C. § 119(e) to U.S. Provisional Patent Application No. 61/305,482, entitled "Gas Knife To Prevent Immersion Liquid Reaching A Stage Mounted Encoder Plate", filed on Feb. 17, 2010. The content of each of the foregoing applications is incorporated herein in its entirety by reference.

FIELD

The present invention relates to a table, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509, 852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

In lithography the measurement of position may be performed by an encoder which shines a beam onto an encoder plate and senses the reflected beam. The beam can be interfered with by anything in its path. That can result in errors being introduced into readings or readings not being made or being completely wrong.

It is desirable, for example, to provide an apparatus in which the likelihood of errors in sensor readings is at least reduced.

According to an aspect, there is provided a table for a lithographic apparatus, the table comprising: an encoder plate located on the table, a gap between the encoder plate and a top surface of the table, the gap located inward of the encoder plate relative to the periphery of the table, and a fluid extraction system with one or more openings in the surface of the gap to extract liquid from the gap.

According to an aspect, there is provided a table for a lithographic apparatus, the table comprising: an encoder plate located on the table, a gap between the encoder plate and a top surface of the table, the gap located inward of the encoder plate relative to the periphery of the table, and a gas knife opening to provide a flow of gas to prevent a droplet of liquid from reaching the encoder plate.

According to an aspect, there is provided a lithographic apparatus comprising: a substrate table; an encoder plate; and an opening for the passage therethrough of a gas, the opening arranged and positioned to direct the gas exiting the opening to hinder droplets of liquid passing radially outwardly relative to a projection system onto the encoder plate, or to blow droplets radially inwardly off the encoder plate, or both.

According to an aspect, there is provided a device manufacturing method comprising: projecting a patterned beam of radiation onto a substrate; measuring a property using an emitter to project a beam of radiation along a sensor beam path to an encoder plate; and directing gas out of an opening to hinder droplets of liquid passing radially outwardly relative to a projection system onto the encoder plate, or to blow droplets radially inwardly off the encoder plate, or both.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIG. 7 illustrates schematically, in cross-section, an embodiment of the present invention;

FIG. 8 illustrates a cross-sectional side view of an embodiment of the substrate table taken along X'-X' of FIG. 9. The gas knife 310 of FIG. 7 is not shown;

FIG. 9 illustrates a top view of an embodiment of a substrate table with one or more encoder plates around the periphery of the substrate table;

DETAILED DESCRIPTION

Figure 1:
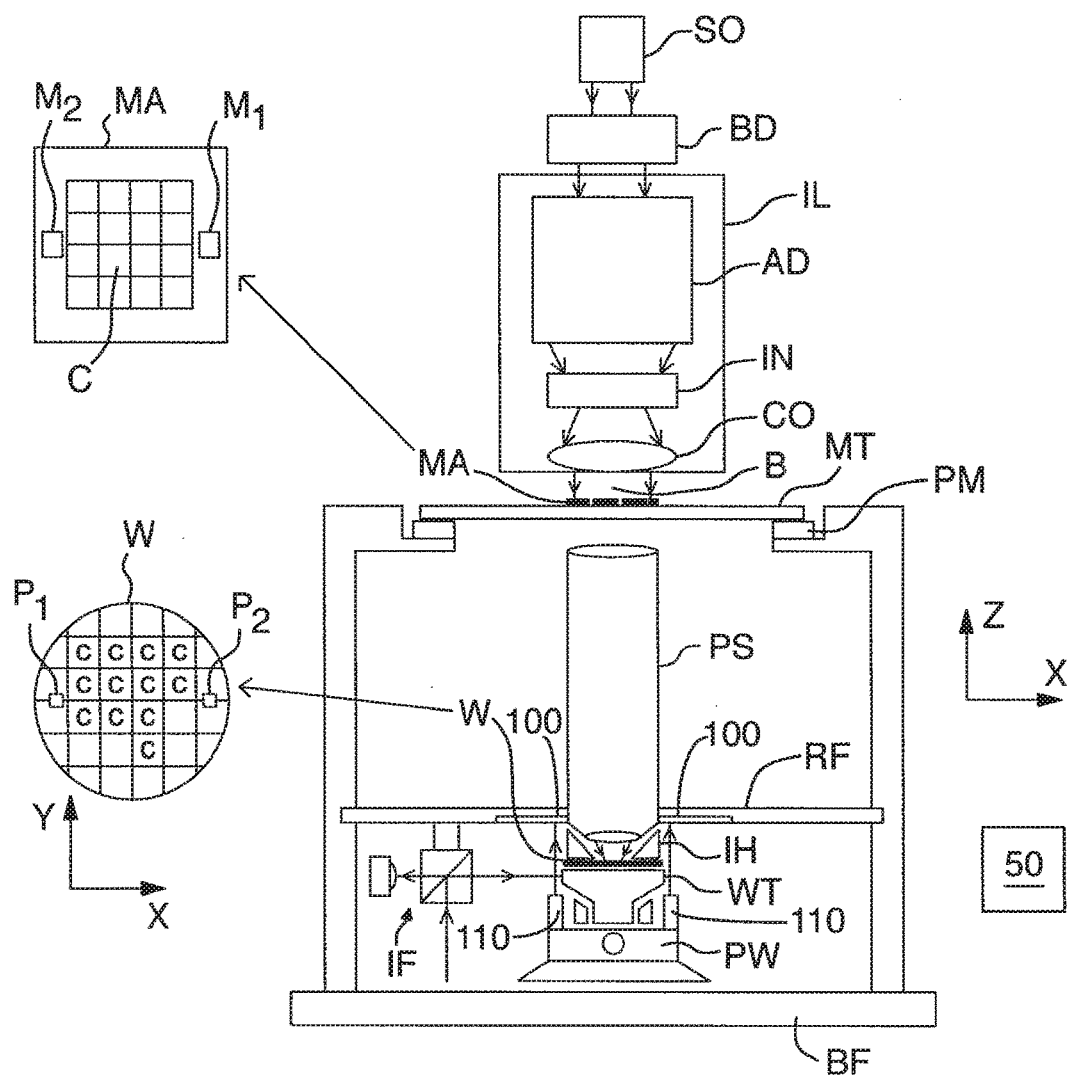
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system S. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-5 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

A further immersion lithography, solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

In European patent application publication no. EP 1420300 and United States patent application publication no. U.S. 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
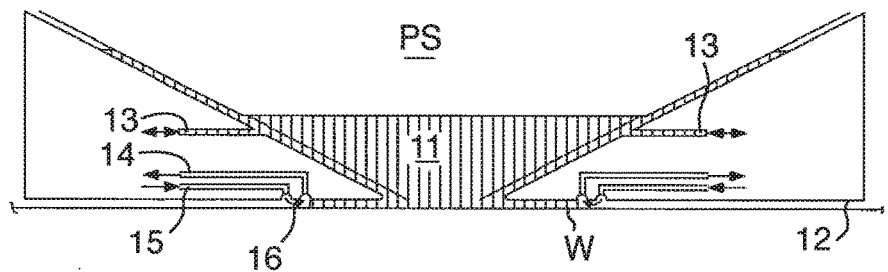
FIG. 5 depicts a further liquid supply system for use in a lithographic projection apparatus.

FIG. 5 schematically depicts a localized liquid supply system or fluid handling system with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure 12 and the surface of the substrate W and may be a contactless seal such as a gas seal (such a system with a gas seal is disclosed in European patent application publication no. EP-A-1,420,298) or liquid seal.

The liquid confinement structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the liquid confinement structure 12 positioned below and surrounding the final element of the projection system PS. Liquid is brought into the space below the projection system PS and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the barrier member 12 and the surface of the substrate W. The gas seal is formed by gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. U.S. 2004-0207824, which is hereby incorporated by reference in its entirety. In an embodiment, the liquid confinement structure 12 does not have a gas seal.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no U.S. 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm, desirably 5 to 50 μm. In an embodiment, the porous material is at least slightly liquid-philic (e.g., hydrophilic), i.e. having a contact angle of less than 90° to the immersion liquid, e.g. water.

Many other types of liquid supply system are possible. An embodiment of the present invention may be advantageous for use with a confined immersion system in which the liquid between the final element of the projection system and the substrate is confined, for example, in optimizing the use. However, an embodiment of the present invention can be used with, and is not limited to, any particular type of liquid supply system.

Figure 6:
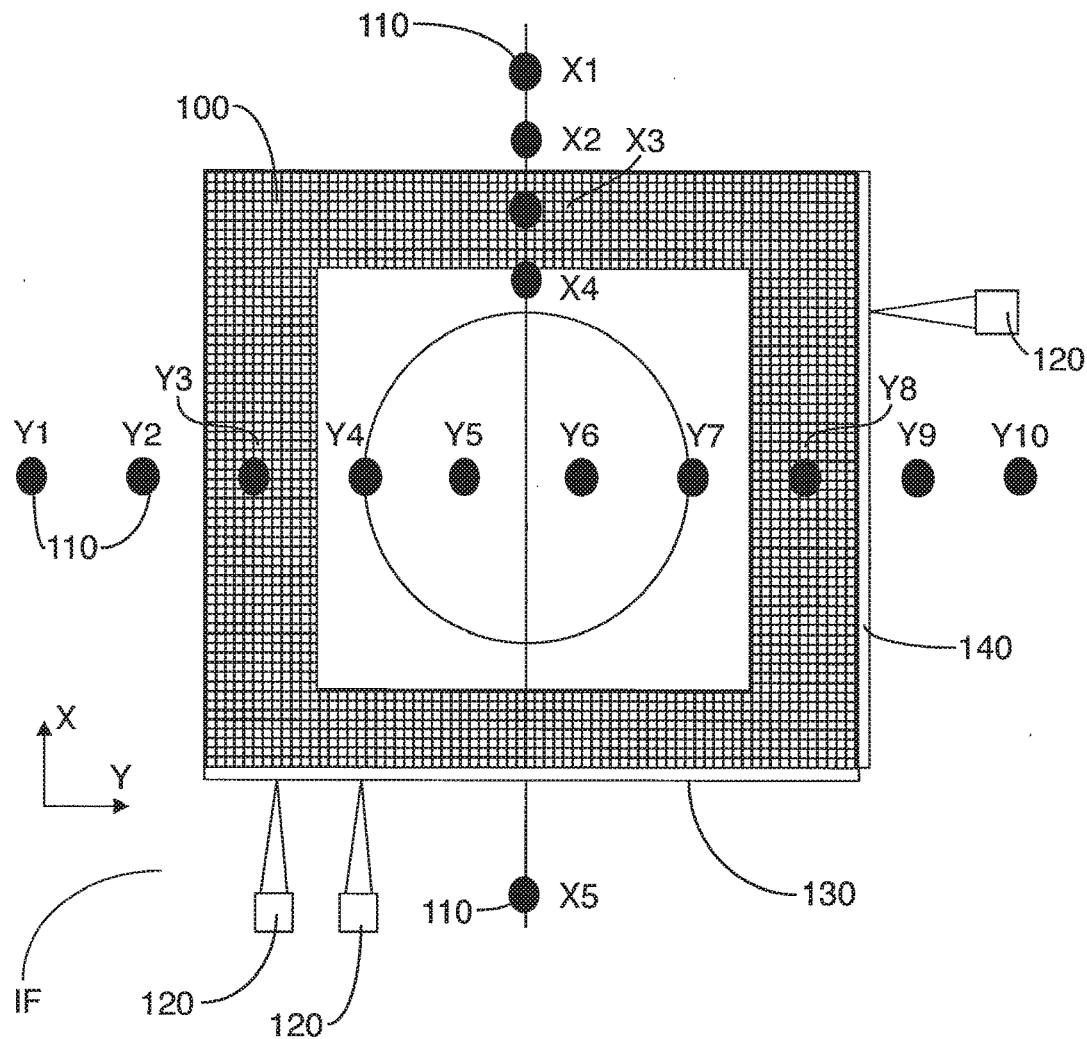
FIG. 6 illustrates, in plan, a substrate table and first and second position detection systems.

As illustrated in FIGS. 1 and 6, a table of the lithographic apparatus, for example a substrate table WT, is provided with one or more components of first and second position detection systems. The first position detection system is an encoder type system for example as described in United States patent application publication no. U.S. 2007/0288121, the entire contents of which is hereby incorporated by reference.

The first position detection system comprises a target or encoder plate 100 and a plurality of encoders or detectors 110 (sometimes referred to as an encoder head) comprising an emitter/receiver combination (Y1-Y10 and X1-X5 shown in FIG. 6). Either the target or encoder plate 100 or the plurality of encoders 110 is mounted to the substrate table WT. As illustrated in FIG. 1, the plurality of encoders 110 are mounted on the substrate table WT and the target or encoder plate 100 is mounted in fixed position relative to the projection system. In an alternative embodiment, as illustrated in FIG. 6, the target or encoder plate 100 is mounted to the substrate table WT and the plurality of encoders 110 are mounted above the substrate table WT in fixed position relative to the projection system PS (e.g., mounted on a reference frame RF which may be supported on a base frame BF).

The target or encoder plate 100 comprises a (e.g. 1D or 2D) grid. The position detection system is constructed and arranged such that at least three encoders 110 can transmit a beam of radiation onto the target or encoder plate 100 and receive a reflected and/or a refracted beam of radiation at any one time.

A second position detection system IF comprises an interferometer which includes three emitter/receiver combinations 120 and at least two mirrors 130, 140 mounted substantially orthogonally on the (e.g., edge of the) substrate table WT.

A beam of radiation from an emitter/receiver combination 120 is directed to a mirror 130, 140 and reflected back. One or two emitter/receiver combinations 120 are provided for each axis.

The positions determined may be the X, Y and Rz degrees of freedom. In an embodiment the positions determined additionally include the Rx and Ry degrees of freedom.

The first position detection system is particularly accurate and can be used for fine position measurement in proximity to the fixed component of the first position detection system. For example, the fixed component of the target or encoder plate 100 and plurality of encoders 110 can be in fixed position surrounding the axis of the projection system PS.

However, because of the limited size, in plan, of the substrate table WT, this system either requires a large footprint for the fixed component (which is usually not available) or can only be used for positioning in a local area.

In an arrangement of an encoder system, one or more encoder plates (e.g., encoder grid plates) 100 are mounted on the substrate stage WT, which are detected using an associated detector 110 (sometimes referred to as the encoder head) mounted on, for example, a separate frame. The separate frame may, for example, hold the projection system PL and/or a structure of the immersion liquid supply system IH. Due the presence of immersion liquid, the encoder system may encounter difficulties in operating.

In a design of an encoder system, one or more encoder plates 100 are mounted on the surface of the substrate table WT. However, this is an exposed location that leaves the encoder plate(s) 100 prone to the landing of a droplet or film of liquid thereon (reference hereinafter to droplet includes reference to film). The droplet could originate from liquid (e.g., water) lost from liquid of a localized immersion system IH, such as confined in an immersion liquid confinement structure (sometimes referred to as an immersion hood).

A liquid droplet that lands on an encoder plate 100 could cause evaporative cooling, local cooling of the encoder plate 100, and/or distortion of the encoder plate 100. Proper encoder measurements may not be possible where there is a droplet or a contaminant (that could be carried by the droplet) on the encoder plate 100. When a droplet dries, it could leave a drying mark. Such a droplet, contaminant, and/or a drying mark may be generally considered as contamination. Contamination sites on the encoder plate 100 should not be used to make encoder measurements and so should be cleaned. Cleaning may cause downtime and loss of productivity. Measurement using the encoder plate 100 in the location of such distortion or contamination may prevent a sufficiently accurate measurement to be made by the encoder system. The overlay accuracy of the encoder system may be degraded.

A solution is to have a back-up interferometer system in addition to the encoder system as described above and illustrated in FIGS. 1 and 6. In such a system, if the encoder measurement cannot be used because of distortion of and/or contamination on the encoder plate 100, the positioning and/or measurement system falls back and uses the interferometer measurement. Using the interferometer system comes at a cost of reduced overlay accuracy and added complexity.

Referring to FIG. 7, in a design of an immersion system, a substrate fluid extraction system to remove liquid (with gas) may be located in an inner gap 200 between an edge of a substrate W (when present on a substrate table WT) and a surface 210 of the table WT surrounding the substrate W. (The surface 210 may in part form a recess in the table WT into which the substrate is located during exposure.) An additional fluid extraction system may be located in an outer gap 300 (or groove) between the encoder plate 100 and the surface 210 of the substrate table WT surrounding the substrate W, where the encoder plate 100 is outward of the substrate W and the surface 210 of the substrate table WT surrounding the substrate W.

In an embodiment, the encoder plate 100 surrounds the surface 210 of the table WT. Optionally, a further surface of the substrate table WT may be outward of the encoder plate 100.

In the outer gap 300 may be a gas knife opening (e.g., an air knife opening) 310 located so that a gas flow (e.g., air flow) 320 from the gas knife opening 310 acts as a barrier to help prevent a liquid droplet from reaching the encoder plate 100. If a droplet moves towards the encoder plate 100, it will be blocked by the gas flow 320 from the gas knife and captured by an additional fluid extraction system 330 and/or by the substrate fluid extraction system associated with inner gap 200.

In an embodiment, the substrate fluid extraction system associated with inner gap 200 and the additional fluid extraction system 330 may be connected and share one or more liquid removal capabilities (e.g., a low pressure source). Such an arrangement is shown in FIG. 7.

Referring to FIG. 8, a burl chuck or substrate support 400 supports and holds a substrate W by, for example, vacuum (source 410). A substrate table cover (e.g., a cover plate) 500 surrounding the substrate support 400 can also be held by vacuum in a similar way although in an embodiment it may be integral with the substrate support 400. A removable form of the cover 500 may be easily replaced during maintenance when its surface or coating degrades. The cover 500 may provide the surface 210 of the substrate table WT between the substrate W and the encoder plate 100. Such an arrangement is shown in FIG. 8.

In an embodiment in the outer gap 300 between the cover 500 and the encoder plate 100 comprises a groove 305 and a fluid extraction system (a bubble extraction system (BES)) 330 comprising a gutter 307. The outer gap 300 may be along or around the inner boundary of the one or more encoder plates 100 on the substrate table WT. The substrate table WT may have an inner gap 200 between the substrate W and the cover 500, around the substrate W (see FIGS. 6-8). The fluid extraction system associated with the inner gap 200, the outer gap 300, or both, removes remaining liquid in the respective groove 205, 305. The liquid may be removed in a single phase flow or in a two phase flow. The fluid extraction system in the outer gutter 307 in combination with the gas knife 310 (see FIG. 7) on the substrate table WT helps prevent a liquid droplet from landing on the encoder plate 100. If a droplet moves e.g. rolls towards the encoder plate 100, the droplet would be blocked from reaching the encoder plate 100 by the gas knife 310. The droplet would be captured by the fluid extraction system in the outer gap 300 and/or the fluid extraction system in the inner gap 200. At least some of the gas from the gas knife 310 may be extracted by the fluid extraction system in the outer gap 300.

In the design of FIG. 9, there is an encoder plate BES or gutter 307 (i.e. the fluid extraction system 330 associated with the outer gap 300) between the substrate table cover 500 and the encoder plate 100. The substrate table WT has one or more gas knives 310 (radially) outward of the encoder plate BES.

Gas flow from a gas knife can encourage evaporative cooling that may distort an encoder plate 100. Distortion of the encoder plate 100 may lead to worse overlay performance. The cooling effects could be compensated by the gas knife blowing gas which is warmer than the ambient gas (or warmer than the ambient temperature). Alternatively or additionally, the gas flow from the gas knife 310 could include humid gas so as to reduce the rate of evaporative cooling.

The gas atmosphere in the apparatus is desirably of constant humidity. Mixing gases with different humidities is a source of instability. Hence in one embodiment all gases released into the atmosphere surrounding the substrate table WT in the tool have substantially the same humidity.

A humid atmosphere is desirable. The encoder plate 100 (which may be referred to as a grid plate) may be made of or covered by quartz which is highly susceptible to distortion by a thermal load. Evaporation is therefore undesirable on quartz and should be prevented. Therefore, droplets can be a problem for the encoder system. Large droplets can be kept away from the encoder plate. Small droplets, which reach the encoder plate, can be suppressed from evaporating, by using a humid atmosphere, thus helping to prevent them from applying an evaporative heat load on the encoder plate 100.

The fluid extraction system 330 associated with the encoder plate 100 can use two phase and/or single phase extraction. If single phase, the humidity of the atmosphere may not be important. However, if the fluid extraction system 330 uses two phase extraction, the atmosphere around the encoders should desirably have high humidity.

In an embodiment, one or more encoder plates 100 are thermally-insulated from the gas flow 320 from or induced by the gas knife 310 and/or the fluid extraction system in the inner and/or outer gap 200, 300. In an embodiment, a controller 50 of the lithographic apparatus may control the gas knife 310 such that only gas flow 320 is provided at the portion of the encoder plate 100 that is near the liquid confinement structure IH. For example, if the immersion liquid confinement structure IH is located over one half of the substrate table WT, the gas knife 310 in that half is active but the gas knife 310 in the other half is not. Similarly, if the immersion liquid confinement structure IH is located over a quadrant of the substrate table WT, the gas knife 310 in that quadrant is active but the gas knife 310 in one or more of the other quadrants is not.

In an embodiment, the (portion of the) gas knife 310 within a certain distance from the immersion liquid confinement structure IH is active, while if outside that distance it is not. The distance may be less than or equal to 1 cm, less than or equal to 2 cm, less than or equal to 3 cm, less than or equal to 4 cm, less than or equal to 5 cm, less than or equal to 6 cm, less than or equal to 10 cm, less than or equal to 15 cm, or less than or equal to 20 cm.

The gas knife 310 could introduce bubbles into the immersion liquid if the immersion liquid confinement structure IH crosses a path of the gas flow 320 from the gas knife 310. Bubble inclusion could happen during, e.g., substrate swap when the confined immersion liquid is transferred to, for example, another stage (such as a substrate stage or a measurement stage (which is not configured to support a substrate)). To help prevent this, FIG. 9 depicts an arrangement in which a gas knife 310 opening is absent from an area 312 of the substrate table WT surface which passes under the confined immersion liquid, for example in an immersion liquid confinement structure IH, during substrate swap.

In embodiment, a transmission image sensor (TIS) 600 may be located at such an area 312 where the gas knife 310 is absent. This may be beneficial where measurement through liquid using the TIS 600 would otherwise occur over or near the gas knife 310 of the encoder plate 100. In an embodiment, the TIS 600 and the path for transfer to another stage may be at the same general location where the gas knife 310 is absent. In an embodiment, the portion of the encoder plate 100 where the gas knife 310 is absent may not be used for measurement; another encoder plate 100 or other portion of the encoder plate 100 may be used in that circumstance (e.g. by another encoder 110). In an embodiment, instead of having an absence of a gas knife 310, a controller 50 of the lithographic apparatus may control the gas knife 310 to be inactive when the confined liquid reaches or approaches the area 312 similar to the embodiments described above, for example for reducing cooling effects from the gas knife 310.

FIGS. 10-21 show different possible arrangements of outer gap 300/gas knife 310. The relative positions of the gas knife 310 opening, the cover 500, and the encoder plate 100 are varied relative to the outer gap 300.

FIGS. 10-21 are embodiments based on the embodiment of FIGS. 7-9. The embodiments of FIGS. 10-21 differ from the embodiments of FIGS. 7-9 as described below.

Figure 10:
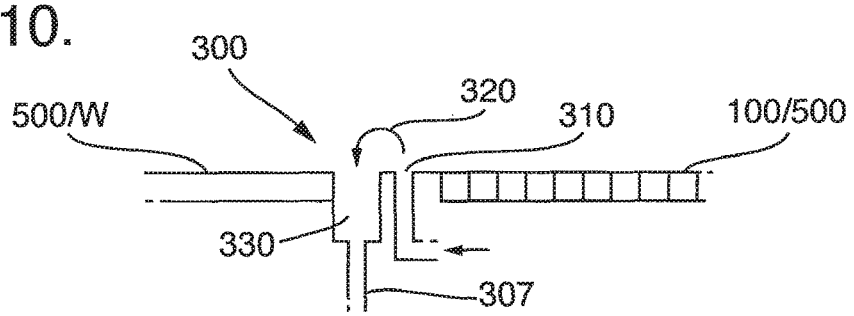
FIGS. 10-21 show, in cross-section, detail of various embodiments of an inner or outer gap.

As shown in FIG. 10, the arrangement of the outer gap 300 in FIG. 7 may be applied to the inner gap 200.

Figure 11:
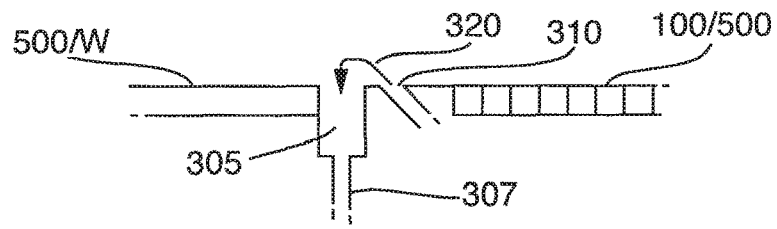

In the embodiment of FIG. 11, the gas flow from the gas knife 310 is angled towards the outer gap 300 or substrate W. A passage which ends in the opening of the gas knife 310 is angled so that gas exits the opening with a horizontal component in a direction away from the encoder plate 100. This may be more effective at blocking droplets from moving onto the encoder plate 100.

Figure 12:
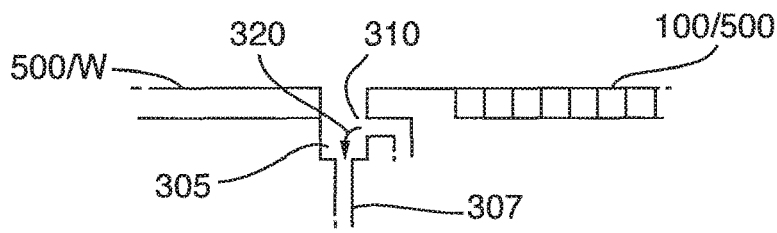

In FIG. 12 the gas knife 310 has an opening which is lower than the top surface of the substrate table WT. The top surface may be co-planar with the top surface of the substrate W, the cover 500 and the encoder plate 100. The opening of the gas knife 310 is present in a side wall of the groove 305 at the bottom of which the gutter 307 is formed. The side wall in which the opening of the gas knife 310 is located is the side wall which faces away from the encoder plate 100 (i.e. the side wall which is closest to the encoder plate 100). The side wall may be closer to the encoder plate 100 than to the substrate support 400.

Figure 13:
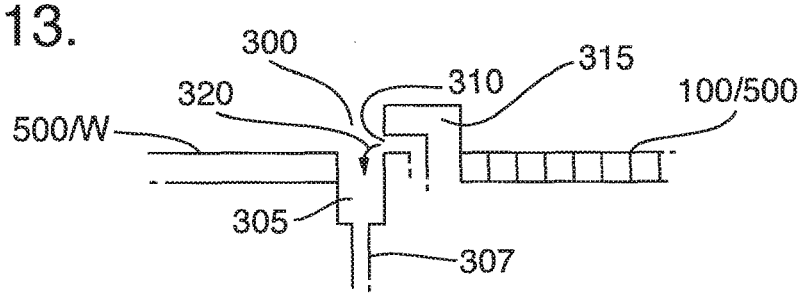

In the embodiment of FIG. 13 the opening of the gas knife 310 is substantially parallel and/or level with the top surface of the substrate table WT formed by the substrate W, cover 500 and/or encoder plate 100. The path of the gas flow 320 from the opening of the gas knife 310 is away from the encoder plate 100 (e.g. towards the outer gap 300 and/or substrate W). The opening of the gas knife 310 may be formed in a raised ridge 315 which is above the plane of the top surface of the substrate table WT. The raised ridge 315 may act as a physical barrier to the passage of droplets onto the encoder plate 100.

Figure 14:
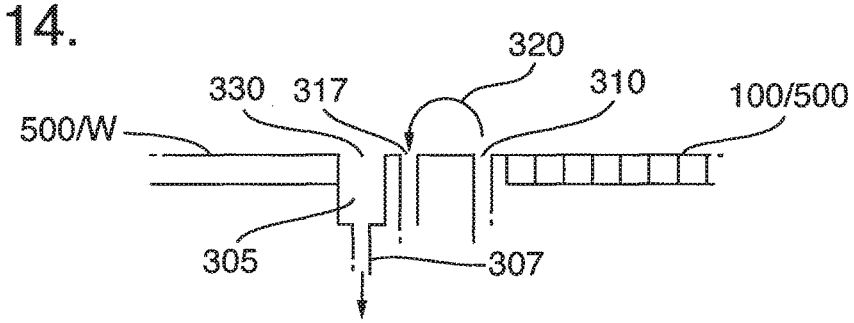

In FIG. 14, a gas extraction opening 317 is formed between the opening of the gas knife 310 and the groove 305 of the fluid extraction system 330. The opening 317 is connected to a low pressure source to extract gas from the gas knife 310 through the extraction opening 317. Too much gas flow 320 can disrupt the functioning of encoders and their conditioning. If gas is supplied through the gas knife 310 without extraction, local pressures can change, affecting performance. Therefore, the embodiment of FIG. 14 is desirable in that it extracts excess gas from the gas knife 310 thereby stabilizing local pressure.

Figure 15:
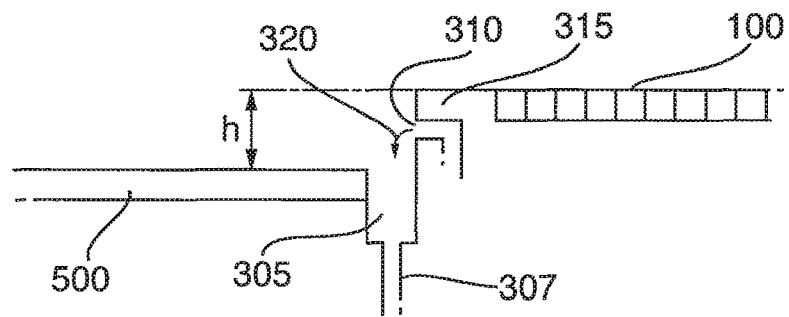

The embodiment of FIG. 15 is similar to the embodiment of FIG. 13 except that the encoder plate 100 is raised relative to the top surface of the remainder of the substrate table WT by a distance h. This reduces the chance of a droplet reaching the encoder plate 100. The path of gas flow 320 is directed (radially) inwards (relative to the substrate W). The details of the raised encoder plate may be substantially similar to the arrangement disclosed in U.S. patent application Ser. No. 61/241,724, filed 11 Sep. 2009, which is hereby incorporated in its entirety by reference.

Figure 16:
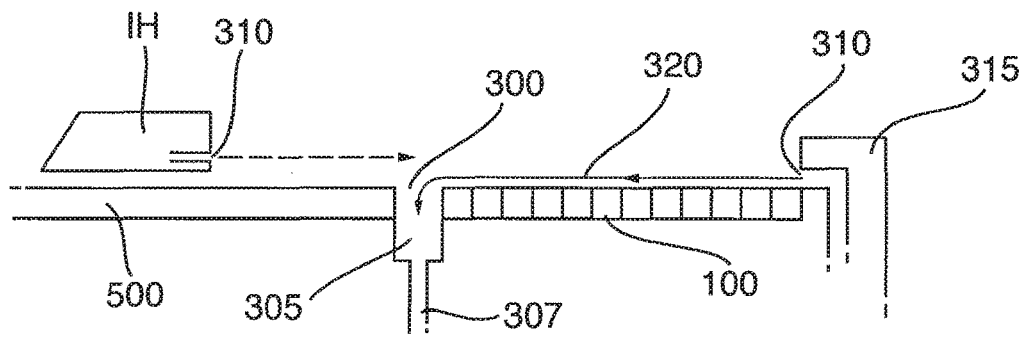
Figure 17:
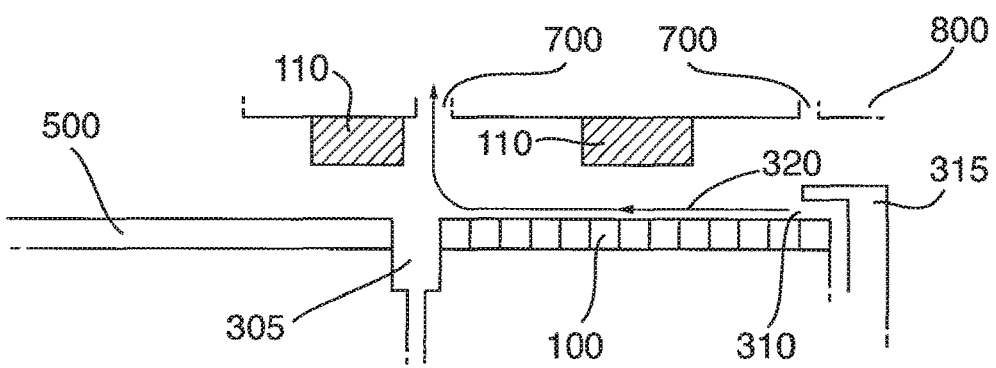
Figure 18:
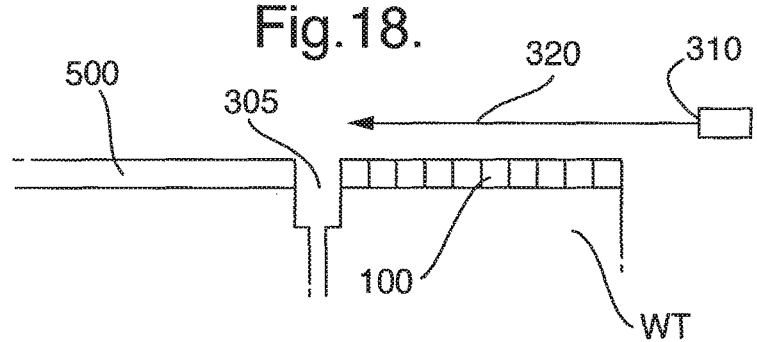

The embodiments of FIGS. 16-18 generate a (radially) inward flow of gas from the outer most edge of the encoder plate (relative to the substrate). The flow of gas may be provided by a gas knife 310. The gas flow 320 is directed to blow a droplet (radially) inwardly off the encoder plate 100.

In the embodiment of FIGS. 16 and 17 the gas knife 310 opening is located (radially) outwards of the encoder plate 100 in a projection 315 of the substrate table WT. The flow path 320 of the gas exiting the gas knife 310 is (radially) inward over the encoder plate 100. The gas flow retards movement of a droplet towards the encoder plate and if a droplet lands on the encoder plate it is blown back into the outer gap 300 i.e. entrained in the gas flow 320 from the gas knife 310 to be displaced to the outer gap 300.

As illustrated in FIG. 16 the gas knife 310 may alternatively or additionally be positioned in a side surface of the liquid supply system, such as a liquid confinement structure IH. In such an embodiment the flow of gas 320 is (radially) outward over the encoder plate 100 and is effective to move any droplets which have found their way onto the encoder plate (radially) outwards. A system may be put in place to recover liquid blown by the gas knife 310 on the liquid confinement structure IH. A controller 50 may be used such that gas only exits the gas knife 310 when the part of the opening through which gas is exiting is within a certain distance of an encoder plate 100.

The embodiment of FIG. 17 is the same as the embodiment of FIG. 16 except that an extraction outlet opening 700 is formed in a surface above and facing the substrate table WT for the extraction of gas into the body in whose surface the opening 700 is formed after it becomes located (radially) inwardly over the top surface of the encoder plate 100. The opening 700 could, for example, be an opening of a gas conditioning system such that the gas flow is recovered by a gas conditioning system above the substrate table WT. The gas conditioning system could be associated within an encoder head support 800 which supports one or more encoders 110.

One or more extraction outlet openings 700 may be provided such that, at all locations at which the encoder is located relative to the encoder plate 100 during operation, a gas flow 320 over the encoder plate 100 can be generated. That is, extraction outlet openings 700 are provided such that in all operational location's at least one extraction outlet opening 700 is positioned (radially) inwardly (relative to the substrate W) of the encoder plate 100. The controller 50 may be used such that extraction only occurs through an opening 700 when it is (radially) inward of the encoder plate 100 and/or the nearest to the encoder plate 100 of the openings (radially) inward of the encoder plate 100.

While the embodiment of FIG. 17 is shown with a gas knife arrangement 310 of FIG. 16, the use of one or more openings 700 above the substrate table WT may be used with any other gas knife arrangements described herein. In particular the opening 700 may be used with the arrangement shown in FIG. 18 or with the embodiment of FIG. 16 where the gas knife 310 is provided in the liquid supply system IH.

In the embodiment of FIG. 18 the opening of the gas knife 310 is located in a component or body separate from the substrate table WT. The flow of gas 320 follows a path similar to that illustrated in FIGS. 16 and 17. This has an advantage of a height step not being present on the substrate table WT, which may be undesirable. A height step can influence liquid flow, by pinning the meniscus of the liquid. A component in which the opening of the gas knife 310 may be present includes an encoder support 800 such as that illustrated in FIG. 17, for example, and/or a frame of the apparatus and/or encoder itself, for example.

The embodiments of FIGS. 16-18 (and that of FIG. 19) are particularly suitable for the use of humid gas exiting the gas knife 310. This is because the gas flow over the encoder plate 100 can also be used as a conditioning gas. A conditioning gas is a uniform fluid of constant composition and/or temperature and/or humidity to avoid changes in refractive index and thereby the introduction of an error or inaccuracy into the reading of the sensor.

Figure 19:
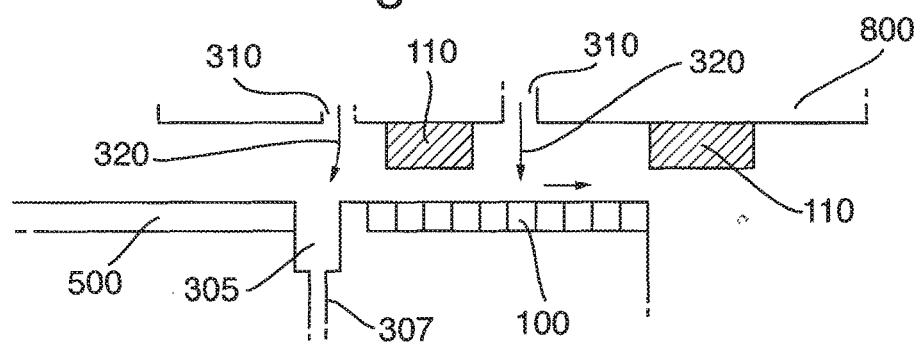

In the embodiment of FIG. 19 the gas knife 310 opening is located in a surface above the substrate table WT, for example in a surface of a frame located above the substrate table WT. The frame may be, for example, the encoder head support 800. The gas knife 310 could blow gas down towards the substrate table surface WT as illustrated. A plurality of gas knives 310 could be provided so that droplets can be blocked from moving onto the encoder plate 100 and/or to condition gas between whichever encoder 110 is being used to determine the position of the substrate table WT at any given time and the encoder plate 100.

Each of FIGS. 16-19 show an additional fluid extraction system having a groove 305 (the same as that of FIGS. 7-15) inwardly of the encoder plate 100. This is beneficial because it helps ensure that the gas from the gas knife 310 is collected and substantially does not reach the substrate W. These arrangements could have the gas supply attached to a frame such as the metro frame RF (i.e. metrology frame) so that the gas supply is stationary with respect to the immersion liquid confinement structure IH. Extraction inward of the encoder plate 100 and outward of the substrate W will help prevent large droplets from reaching the encoder plate 100 and help prevent the conditioning gas on the encoder plate 100 from affecting the substrate W.

Figure 20:
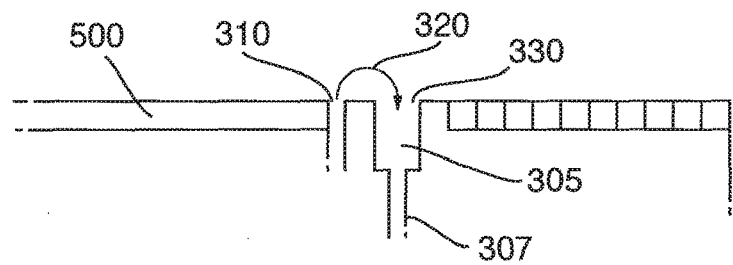

In FIG. 20 the position of the additional fluid extraction system 330 and gas knife 310 is reversed from that in the embodiment of FIG. 9.

Figure 21:
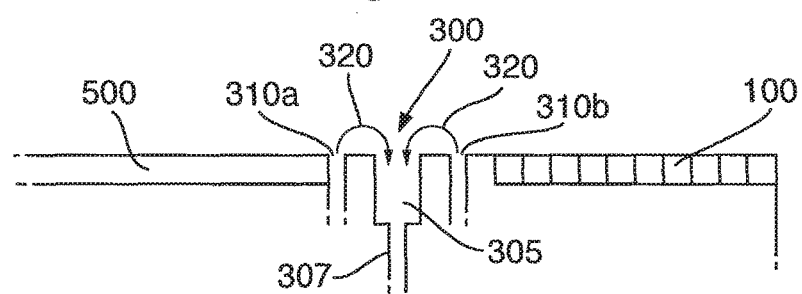

The embodiment of FIG. 21 shows a gas knife 310A, 310B on either side of the additional fluid extraction system having a groove 305.

Figure 22:
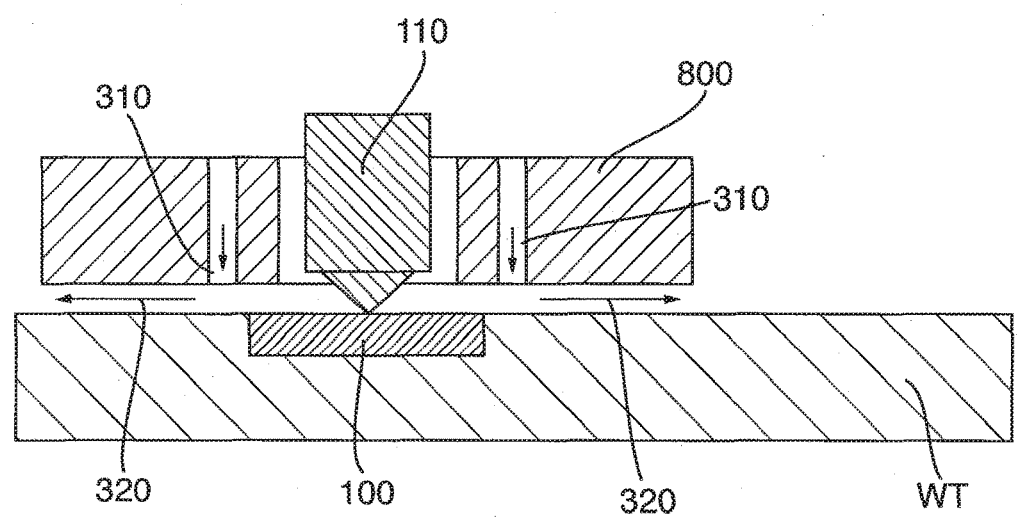
FIG. 22 illustrates, in cross-section, an arrangement with a gas flow to block droplets with shear flow.

FIG. 22 illustrates an embodiment similar to that of FIG. 19 in which a horizontal flow 320 over the surface of the encoder plate 100/substrate table WT around an encoder 110 is generated. A gap formed between the encoder plate 100 and the surface in which the opening of the gas knife 310 is formed results in the gas flowing substantially parallel to the encoder plate 100. This results in a flow (radially) out from the encoder 110. So any droplets on the encoder plate 100 are blown (radially) inward or (radially) outward (or to the side), depending on their starting position relative to the encoder 110. The horizontal flow is a shear flow applying a shear force to a droplet which reaches the encoder plate 100.

In the embodiment of FIG. 22 the shear pressure helps prevent droplets reaching the point at which radiation from the encoder 110 impinges upon the encoder plate 100. The gap between the bottom of the surface in which the opening of the gas knife 310 is formed and the top surface of the encoder plate 100 is desirably 0.1-1 mm whereas the length of the gap in a plane parallel to the top surface of the encoder plate 100 is desirably 2-20 mm long. This geometry is desirable as it creates a strong (radially) outward flow of gas 310 away from the encoder 110.

In an embodiment similar to that disclosed in U.S. patent application no. U.S. 61/376,653, filed on 24 Aug. 2010, which is hereby incorporated in its entirety by reference and having regard to FIG. 23, a first outlet 310a to provide a fluid with a first flow 320a characteristic (i.e. turbulent flow) is provided (radially) inwardly of a second outlet 310b. The second outlet 310b provides a fluid with a second flow 320b characteristic which is different to the first flow 320a characteristic (e.g. a laminar flow). The inner flow 320a is for the purpose of conditioning the atmosphere around the encoder 110 and the outer flow 320b is laminar to keep liquid away from the encoder 110 and off the encoder plate 100. The inner high speed turbulent jet may also function as a gas knife to keep droplets away from the encoder 110. The second radially outwardly gas supply is a more benign laminar flow. This gas is used as a buffer to keep the surrounding compartment gas (e.g., air) away from the inner flow such that only the well controlled outer flow 320b is mixed with the turbulent inner flow 320a.

Figure 23:
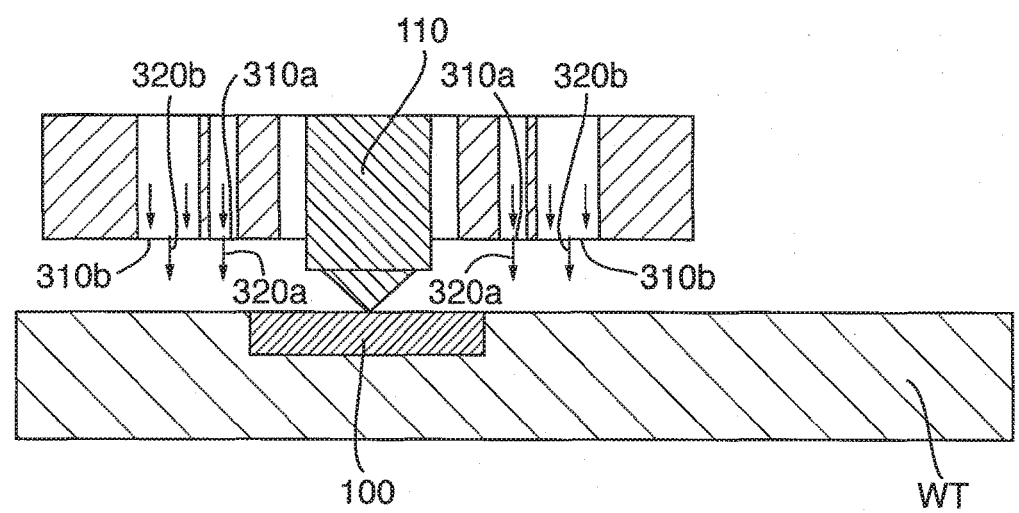
FIG. 23 illustrates, in cross-section, an arrangement with a gas flow towards the encoder plate.

The gas flow 320 can be in a plane substantially parallel to the opening of the fluid extraction system 330 or BES, e.g., the outer gap 300 (see FIGS. 16 to 18) or substantially perpendicular to the outer gap 300 (FIGS. 19, 22 and 23).

In an embodiment, the gas knife 310 may be supplied without a fluid extraction system 330, for example associated with an outer gap 300 between the encoder plate 100 and a (radially) inward surface of the substrate table WT, for example a cover plate 500.

The gas knife 310 may be an opening in the form of a plurality of apertures which may be circular, a series of elongated apertures, e.g. slits, a continuous slot, a two dimensional array or a porous plate such as a micro sieve. The opening may be around the interior periphery of the one or more encoder plates 100. The opening may be a straight or curved line and/or a plurality of straight or curved lines.

In the depicted arrangements, the outer gap 300 with its fluid extraction system 330 and the gas knife 310 opening is adjacent to (and between) the encoder plate 100 and the cover 500. These features may be, for example, adjacent to (and between) the substrate support 400 and the cover 500 (as illustrated in FIG. 9), around the outside peripheral edge of the encoder plate 100, and/or along a crossing lane (see U.S. patent application No. 61/241,724 filed 11 Sep. 2009).

The surface around the gas knife 310 opening could have a liquidphobic (e.g., hydrophobic) surface, for example in the form of a coating. The surface around the gas knife 310 opening could be substantially level with, raised above or lower than the surrounding surface of, for example, the substrate table, the encoder plate, or both.

In an embodiment, the outer gap 300 may be passive. For example, the outer gap 300 may have a sponge to absorb liquid. An advantage would be less evaporative cooling compared to an active outer gap having a fluid extraction system and/or gas knife.

In an embodiment, an O-ring seal and/or a sticker may be provided between the cover 500 and the encoder plate 100. The O-ring seal and/or sticker may have a liquidphilic property.

An embodiment of the invention may help to prevent an immersion liquid droplet landing on the encoder plate 100, thereby improving overlay accuracy. The reduction, if not the absence, of droplets landing on the encoder plate 100 may help to reduce contamination of the encoder plate 100. As a consequence, the downtime to clean an encoder plate 100 may be reduced.

As will be appreciated, any of the above described features can be used with any other feature (e.g. combining any of the embodiments of FIGS. 10 to 23) and it is not only those combinations explicitly described which are covered in this application. For example, an embodiment of the invention could be applied to the embodiments of FIGS. 2 to 4.

In an embodiment, there is provided a substrate table for a lithographic apparatus, the substrate table comprising: an encoder plate located on the substrate table; a gap between the encoder plate and a top surface of the substrate table, the gap located radially inward of the encoder plate relative to the periphery of the substrate table; and a fluid extraction system with an opening in the surface of the gap to extract liquid from the gap.

In an embodiment, a gas knife opening is associated with the gap, the gas knife configured to provide a flow of gas to help prevent a droplet of liquid from reaching the encoder plate. In an embodiment, the gas knife opening is configured so that the gas flow from the gas knife opening flows into the gap.

In an embodiment, there is provided a substrate table for a lithographic apparatus, the substrate table comprising: an encoder plate located on the substrate table; a gap between the encoder plate and a top surface of the substrate table, the gap located radially inward of the encoder plate relative to the periphery of the substrate table; and a gas knife opening to provide a flow of gas to prevent a droplet of liquid from reaching the encoder plate.

In an embodiment, the substrate table further comprises a substrate support to support a substrate and a gap radially outward of the substrate support and radially inward of the top surface of the substrate table. In an embodiment, the substrate table further comprises a cover plate, wherein at least part of the top surface of the substrate table is a surface of the cover plate. In an embodiment, the encoder plate is located at the periphery of the substrate table. In an embodiment, the encoder plate is around the periphery of the substrate table.

In an embodiment, there is provided a lithographic apparatus comprising a substrate table as described herein.

In an embodiment, the lithographic apparatus further comprises a liquid confinement structure configured to supply and confine immersion liquid between a projection system and a facing surface, the facing surface comprising a surface of the substrate table, a substrate supported by the substrate table, or both.

In an embodiment, there is provided a lithographic apparatus comprising: a substrate table; an encoder plate; and an opening for the passage therethrough of a gas, the opening arranged and positioned to direct the gas exiting the opening to hinder a droplet of liquid passing radially outwardly relative to a projection system onto the encoder plate or to blow a droplet radially inwardly off the encoder plate, or both.

In an embodiment, the encoder plate is located on a top surface of the substrate table. In an embodiment, the opening is radially outward of the encoder plate. In an embodiment, the opening is in the substrate table. In an embodiment, the opening is in a component separate from the substrate table. In an embodiment, the opening is in a surface above and facing the encoder plate. In an embodiment, in use, the opening directs the gas towards the encoder plate. In an embodiment, a gap formed between the encoder plate and the surface in which the opening is formed results in the gas flowing substantially parallel to the encoder plate. In an embodiment, the opening is the opening of a gas knife. In an embodiment, the lithographic apparatus further comprises a fluid extraction system with an opening in a surface of a body to extract fluid into the body. In an embodiment, the body is the substrate table. In an embodiment, the body is a body other than the substrate table. In an embodiment, the surface is, in use, a surface above and facing the encoder plate. In an embodiment, the gas exits the opening in a direction away from the encoder plate or the gas flow is in a direction over the radial width of the encoder plate.

In an embodiment, there is provided a device manufacturing method comprising projecting a patterned beam of radiation onto a substrate, wherein a property is measured by using an emitter to project a beam of radiation along a sensor beam path to an encoder plate, wherein a gas is directed out of an opening to hinder droplets of liquid passing radially outwardly relative to a projection system onto the encoder plate, or to blow droplets radially inwardly off the encoder plate, or both.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a table comprising:
a substrate support to support a substrate,
an encoder plate located in, or on, the top of the table,
a gap that is outward, in the horizontal, of the substrate when supported by the substrate support and that is inward, in the horizontal, of a top surface of the encoder plate, and
a fluid opening in a surface at the gap for extraction of liquid from the gap;
a projection system configured to project a beam of radiation onto a radiation-sensitive target portion of the substrate;
a liquid supply system configured to supply the liquid via an inlet with a liquid supply opening to a space between the table and the projection system;
a fluid extraction system with an extraction opening in a surface of a body to extract fluid into the body, the body being above the substrate table; and
a fluid extraction opening, located outward and separated from the body and located above the table, configured to remove fluid from the encoder plate.

2. The lithographic apparatus of claim 1, further comprising a fluid supply opening configured to provide fluid to help prevent liquid from reaching the encoder plate or to help remove a droplet of liquid from the encoder plate.

3. The lithographic apparatus of claim 1, further comprising a cover plate, wherein at least part of the cover plate is located between the gap and the encoder plate.

4. The lithographic apparatus of claim 1, wherein the encoder plate is located at the periphery of the table.

5. The lithographic apparatus of claim 1, further comprising an encoder detector configured to cooperate with the encoder plate, wherein the fluid extraction opening is located between the encoder detector and the body.

6. The lithographic apparatus of claim 1, further comprising an encoder detector configured to cooperate with the encoder plate and a fluid supply opening configured to supply gas on opposite sides of the encoder detector toward the encoder plate.

7. The lithographic apparatus of claim 1, further comprising a plurality of encoder detectors configured to cooperate with the encoder plate and wherein the fluid extraction opening is located between at least two encoder detectors of the plurality of encoder detectors.

8. The lithographic apparatus of claim 1, wherein the fluid extraction opening comprises a plurality of outlet apertures, each outlet aperture facing toward the table.

9. The lithographic apparatus of claim 1, wherein the table further comprises a passage that is outward, in the horizontal, of the gap and that is inward, in the horizontal, of a top surface of the encoder plate, and a fluid opening in a surface at of the passage for extraction of liquid from the passage.

10. A lithographic apparatus comprising:
a table, comprising:
a substrate support to support a substrate,
an encoder plate located in, or on, the top of the table,
a gap that is outward, in the horizontal, of the substrate when supported by the support and that is inward, in the horizontal, of a top surface of the encoder plate, and
a fluid opening in a surface at the gap for extraction of liquid from the gap; and
a projection system configured to project a beam of radiation onto a radiation-sensitive target portion of the substrate;
a liquid handling system comprising an inlet with a liquid supply opening, the liquid supply opening configured to provide the liquid to a space between the table and the projection system and comprising a liquid confinement structure, located above the table, configured to confine at least part of the liquid between the projection system and the table, the liquid confinement structure comprising an extraction opening in a surface of the liquid confinement structure to extract fluid into the liquid confinement structure;
a fluid supply opening configured to provide a fluid toward the encoder plate, the fluid supply opening separated from the fluid confinement structure and located above the table; and
a fluid extraction opening configured to remove fluid from the encoder plate, the fluid extraction opening separated, and located outward, from the fluid confinement structure and located above the table.

11. The lithographic apparatus of claim 10, further comprising a cover plate, wherein at least part of the cover plate is located between the gap and the encoder plate.

12. The lithographic apparatus of claim 10, wherein the encoder plate is located at the periphery of the table.

13. The lithographic apparatus of claim 10, further comprising an encoder detector configured to cooperate with the encoder plate and a fluid supply opening configured to supply gas on opposite sides of the encoder detector toward the encoder plate.

14. The lithographic apparatus of claim 10, further comprising a plurality of encoder detectors configured to cooperate with the encoder plate and wherein the fluid extraction opening is located between at least two adjacent encoder detectors of the plurality of encoder detectors.

15. The lithographic apparatus of claim 10, wherein the table further comprises a fluid supply opening to provide fluid to the gap.

16. The lithographic apparatus of claim 10, wherein the fluid extraction opening comprises a plurality of outlet apertures, each outlet aperture facing toward the table.

17. The lithographic apparatus of claim 10, wherein the table further comprises a passage that is outward, in the horizontal, of the gap and that is inward, in the horizontal, of a top surface of the encoder plate, and a fluid opening in a surface at of the passage for extraction of liquid from the passage.

18. A device manufacturing method comprising:

supplying a liquid to a substrate;

projecting a patterned beam of radiation onto the substrate;

extracting, using an extraction opening in a surface of a body, at least some of the liquid, the body being above the substrate;

measuring a value of a property using a beam of radiation projected along a sensor beam path to an encoder plate located in, or on, the top of a table;

collecting at least some of the liquid in a gap that is outward, in the horizontal, of the substrate and is inward, in the horizontal, of a top surface of the encoder plate;

extracting the at least some of the liquid from the gap through a fluid opening in a surface at the gap; and extracting fluid from the encoder plate using a fluid extraction opening, the fluid extraction opening located outward and separated from the body and located above the substrate.

19. The method of claim 18, further comprising providing a fluid toward the encoder plate via a fluid supply opening, the fluid supply opening separated from the fluid confinement structure and located above the table.

20. The method of claim 18, further comprising using a plurality of encoder detectors to measure values of the property, the encoder detectors configured to cooperate with the encoder plate and wherein the fluid extraction opening is located between at least two adjacent encoder detectors of the plurality of encoder detectors.

* * * * *